United States Patent
Taguchi (10) Patent No.: US 10,043,721 B2
(45) Date of Patent: Aug. 7, 2018

(54) METHOD OF MANUFACTURING SEMICONDUCTOR DEVICE HAVING SEMICONDUCTOR CHIP MOUNTED ON LEAD FRAME

(71) Applicant: SII Semiconductor Corporation, Chiba-shi, Chiba (JP)

(72) Inventor: Yasuhiro Taguchi, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 15/495,058

(22) Filed: Apr. 24, 2017

(65) Prior Publication Data

US 2017/0229355 A1    Aug. 10, 2017

Related U.S. Application Data

(62) Division of application No. 14/644,249, filed on Mar. 11, 2015, now Pat. No. 9,698,064.

(30) Foreign Application Priority Data

Mar. 19, 2014    (JP) .................................. 2014-056450

(51) Int. Cl.
  *H01L 21/44*    (2006.01)
  *H01L 21/48*    (2006.01)
  (Continued)

(52) U.S. Cl.
  CPC .......... *H01L 22/14* (2013.01); *H01L 21/4842* (2013.01); *H01L 21/56* (2013.01);
  (Continued)

(58) Field of Classification Search
  CPC ......... H01L 23/49541; H01L 23/49551; H01L 21/4842; H01L 21/56; H01L 24/85;
  (Continued)

(56) References Cited

U.S. PATENT DOCUMENTS

| 4,801,997 A | 1/1989 | Ono et al. ........................ 357/70 |
| 5,710,064 A | 1/1998 | Song et al. .................... 437/220 |

(Continued)

OTHER PUBLICATIONS

Patent Abstracts of Japan, Publication No. 07-045769, Publication Date Feb. 14, 1995.

(Continued)

*Primary Examiner* — Jami M Valentine
*Assistant Examiner* — Dilinh Nguyen
(74) *Attorney, Agent, or Firm* — Adams & Wilks (57) ABSTRACT

In the manufacture of a semiconductor device using a lead frame, in which an outer lead is electrically connected to an inner lead suspension lead via an inner lead, an encapsulating resin is formed over the inner lead, part of the outer lead, and part of the inner lead suspension lead. The parts of the outer lead and the inner lead suspension lead that protrude from the resin are cut, and a plated film is formed on the portion of the cut outer lead that protrudes from the resin so that a solder layer is easily formed on all exposed surfaces of the outer lead. The inner lead suspension lead includes a narrowed portion that is smaller in cross-sectional area than other portions of the inner lead suspension lead, and an outline of the resin overlaps the narrowed portion of the inner lead suspension lead in plan view so as to suppress impact forces generated when the inner lead suspension lead is cut at the narrowed portion.

5 Claims, 5 Drawing Sheets

(51) Int. Cl.
*H01L 21/50* (2006.01)
*H01L 21/66* (2006.01)
*H01L 23/00* (2006.01)
*H01L 23/498* (2006.01)
*H01L 23/495* (2006.01)
*H01L 21/56* (2006.01)

(52) U.S. Cl.
CPC .. *H01L 23/49513* (2013.01); *H01L 23/49548* (2013.01); *H01L 23/49582* (2013.01); *H01L 23/49805* (2013.01); *H01L 24/32* (2013.01); *H01L 24/48* (2013.01); *H01L 24/49* (2013.01); *H01L 24/73* (2013.01); *H01L 2224/32245* (2013.01); *H01L 2224/48247* (2013.01); *H01L 2224/48465* (2013.01); *H01L 2224/73265* (2013.01)

(58) Field of Classification Search
CPC ........... H01L 23/3107; H01L 2924/181; H01L 2924/00014; H01L 23/49517; H01L 23/3114; H01L 23/49513; H01L 23/49548; H01L 23/49582; H01L 23/49805; H01L 24/32; H01L 24/48; H01L 24/73; H01L 24/49
USPC ....... 257/676, 666, 690, 692, 693, 730, 787; 438/112, 123, 124, 127

See application file for complete search history.

(56) References Cited

U.S. PATENT DOCUMENTS

| | | |
|---|---|---|
| 6,011,303 A | 1/2000 | Tanaka et al. ................. 257/692 |
| 2003/0116842 A1* | 6/2003 | Motonami ........ H01L 23/49586 257/692 |
| 2005/0285240 A1 | 12/2005 | Miyake et al. ............... 257/676 |
| 2008/0284008 A1* | 11/2008 | Urushihata .......... H01L 23/4952 257/735 |
| 2012/0007225 A1 | 1/2012 | Hasebe et al. ................. 257/676 |

OTHER PUBLICATIONS

Patent Abstracts of Japan, Publication No. 2006-019465, Publication Date Jan. 19, 2006.

* cited by examiner

METHOD OF MANUFACTURING SEMICONDUCTOR DEVICE HAVING SEMICONDUCTOR CHIP MOUNTED ON LEAD FRAME

BACKGROUND OF THE INVENTION

1. Field of the Invention

The present invention relates to a semiconductor device using a lead frame and a method of manufacturing the same.

2. Description of the Related Art

A portable electronic device has been downsized in recent years, and a semiconductor package to be used in a semiconductor device has accordingly been required to be downsized and thinned while securing a mounting strength. Employing a surface mount package has been known as a measure for downsizing the semiconductor package, in which an external terminal protrudes in parallel to a substrate mounting surface. Examples of this package type include a small outline non-lead package (SON) and a quad flat non-lead package (QFN). Those packages have a feature in that an external electrode used for mounting the package on a substrate is smaller than that of a dual inline package (DIP) or a small outline package (SOP), and hence a small amount of solder fillet is formed after the package is mounted on the substrate, and a mounting strength is low. Further, those packages are often manufactured with use of a lead frame produced by using a stamping mold or etching process. As a material of the lead frame, a 194 alloy or a copper alloy is used in general.

In manufacturing of the semiconductor device using the lead frame, a semiconductor chip is mounted on the lead frame, and the semiconductor chip and the lead frame are electrically connected to each other via wires. The resultant structure is then subjected to resin encapsulation process and burr process, and exterior plating process is carried out on the copper surface. After the exterior plating process, the semiconductor device is cut off from the lead frame so as to have a predetermined size. As described above, the semiconductor device is cut off from the lead frame after the exterior plating process, and hence no exterior plated film is formed on a cut surface of an outer lead. Accordingly there is a problem in that the solder wettability is poor when the semiconductor device is mounted on the substrate. In order to improve the mounting strength of the semiconductor package produced under such conditions, it is proposed that the shape of an outer lead distal end portion be changed in plan view or cross-sectional view so that the solder wettability after the semiconductor device is mounted on the substrate is improved and a solder fillet is thus easily formed, to thereby increase the mounting strength (for example, see Japanese Patent Application Laid-open Nos. 2006-19465 and Hei 7-45769).

However, along with the progress in downsizing and thinning of a semiconductor device, it is required to further improve the substrate mounting strength of the semiconductor device.

SUMMARY OF THE INVENTION

The present invention provides a semiconductor device having improved solder bonding strength onto a substrate, and a method of manufacturing the same.

In order to solve the problem described above, the following measures are taken.

First, according to one embodiment of the present invention, there is provided a semiconductor device, including: an encapsulating resin for covering a semiconductor chip mounted on an island of a lead frame; an outer lead extending from a side surface of the encapsulating resin; an inner lead connected to the outer lead; an inner lead suspension lead that is connected to the inner lead and extends from the encapsulating resin; and a plated film formed on all of surfaces of the outer lead, the inner lead suspension lead including a first narrowed portion that overlaps with an outline of the encapsulating resin in plan view.

Further, in the semiconductor device, the inner lead suspension lead includes a second narrowed portion in the encapsulating resin in plan view.

Further, in the semiconductor device, the first narrowed portion includes a V notch formed therein.

Further, the semiconductor device further includes a through-hole formed between the first narrowed portion and the second narrowed portion.

Further, according to one embodiment of the present invention, there is provided a method of manufacturing a semiconductor device including: an encapsulating resin for covering a semiconductor chip mounted on an island of a lead frame; and an outer lead extending from a side surface of the encapsulating resin; the method including: preparing a lead frame including: the island; an inner lead close to the island; an inner lead suspension lead and the outer lead that are connected to the inner lead; and an island suspension lead connected to the island, the inner lead suspension lead including a first narrowed portion; die-bonding, wire-bonding, and resin encapsulating the semiconductor chip; cutting a distal end of the outer lead; forming, by electrolytic plating, a plated film on the cut surface of the outer lead; cutting the inner lead suspension lead at the first narrowed portion; and cutting the island suspension lead.

Further, the method of manufacturing a semiconductor device further includes testing electrical characteristics between the cutting the inner lead suspension lead and the cutting the island suspension lead.

According to one embodiment of the present invention, when the semiconductor device is mounted on the substrate, a thick solder layer is formed on all of the surfaces of the outer lead exposed from the encapsulation resin, and hence the semiconductor device can be firmly bonded to the substrate. Further, it is possible to suppress impact exerted on the inner lead, which is caused by a stress applied thereon when the semiconductor device is separated off from the lead frame, and to reliably maintain the connection between the inner lead and the wire electrically connected to a semiconductor element. Thus, the reliability can be improved.

DETAILED DESCRIPTION OF THE INVENTION

Now, the present invention is described with reference to the drawings.

Figure 1:
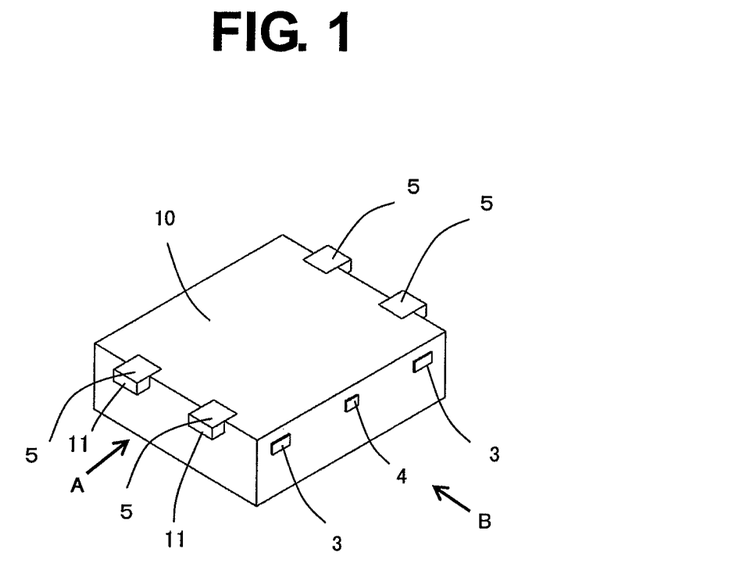
FIG. 1 is a perspective view illustrating a semiconductor device according to an embodiment of the present invention (with an outer lead being illustrated on the upper side).

FIG. 1 is a perspective view illustrating a semiconductor device according to an embodiment of the present invention, in which an outer lead 5 is illustrated on the upper side. The outer lead 5 has an upper surface (mounting surface), a side surface (outer lead cut surface), a surface opposite to the mounting surface, and surfaces each of which forms right angles with the mounting surface, the opposite surface, and the outer lead cut surface. The outer lead 5 extends from an encapsulating resin 10. Further, on a side surface of the substantially cuboid semiconductor device, inner lead suspension leads 3 and an island suspension lead 4 have been cut to expose the cut surfaces from the encapsulating resin 10.

Figure 2:
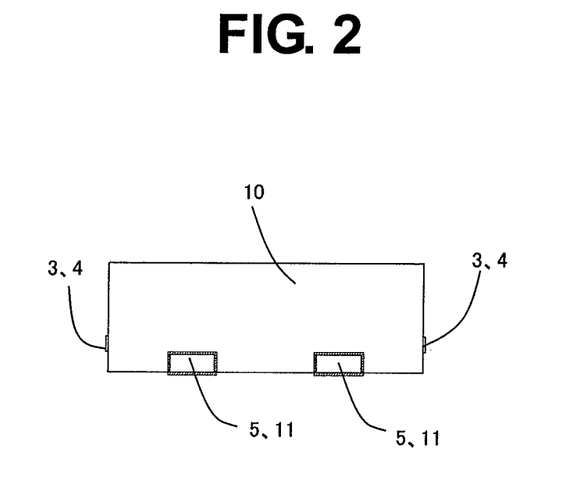
FIG. 2 is a side view of the semiconductor device of the present invention when viewed from the direction A of FIG. 1 (with the outer lead being illustrated on the lower side).

FIG. 2 is a sectional view when viewed from the direction A of FIG. 1, in which the outer lead 5 is illustrated on the lower side and the lower surface of FIG. 2 corresponds to the mounting surface used for mounting the semiconductor device on a substrate. A plated film 5a is formed on the periphery of the outer lead 5. All of the lower surface on the substrate mounting side, the upper surface opposite to the lower surface, the side surfaces, and an outer lead cut surface 11 are covered by the plated film 5a.

Figure 3:
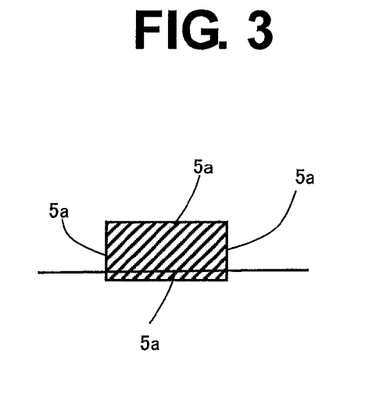
FIG. 3 is an enlarged view of the outer lead of the semiconductor device of the present invention when viewed from the direction A.

FIG. 3 is an enlarged view of the outer lead when viewed from the direction A of FIG. 1. The plated film 5a completely covers the periphery of the outer lead, and a lower surface of the plated film 5a formed on the lower surface on the substrate mounting side is located below a lower surface of the encapsulating resin main body.

Figure 4:
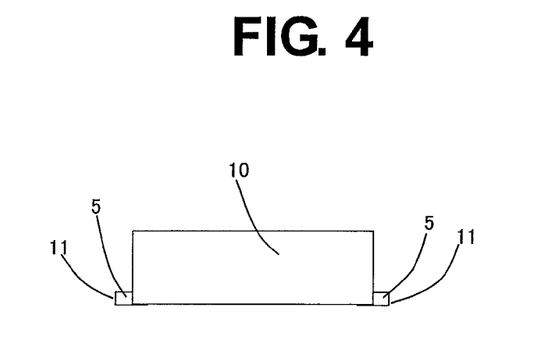
FIG. 4 is a side view of the semiconductor device of the present invention when viewed from the direction B of FIG. 1.

FIG. 4 is a sectional view when viewed from the direction B of FIG. 1, in which the outer lead 5 is illustrated on the lower side and the lower surface of FIG. 4 corresponds to the mounting surface used for mounting the semiconductor device on a substrate. The lower surface on the substrate mounting surface side, the upper surface opposite to the lower surface, and the outer lead cut surface 11 of the outer lead 5 are exposed from the encapsulating resin. The plated film 5a covers all of the exposed surfaces of the outer lead.

Figure 5:
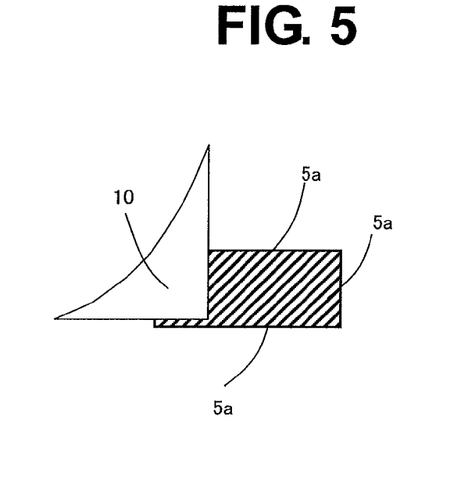
FIG. 5 is an enlarged view of the outer lead of the semiconductor device of the present invention when viewed from the direction B.

FIG. 5 is an enlarged view of the outer lead when viewed from the direction B of FIG. 1.

FIG. 5 illustrates that the outer lead extends from a side surface of the encapsulating resin 10, and the plated film 5a also adheres on the cut surface (right end on the drawing sheet) of the outer lead.

Next, a method of manufacturing the semiconductor device of the present invention is described.

FIGS. 6A to 6F are perspective views each illustrating a method of manufacturing the semiconductor device according to the embodiment of the present invention.

Figure 6A:
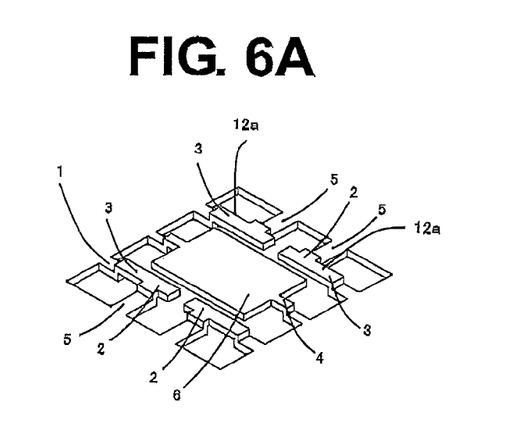
FIGS. 6A to 6F are views each illustrating a method of manufacturing the semiconductor device of the present invention.

FIG. 6A is a perspective view of a lead frame 1 of this embodiment. The lead frame 1 includes an island 6 to be used for mounting a semiconductor chip, inner leads 2 arranged so as to be separated from the island 6, and the outer leads 5 connected to the respective inner leads 2. Further, the inner lead 2 and the island 6 are connected to a lead frame rim by the inner lead suspension lead 3 and the island suspension lead 4, respectively.

The inner lead suspension lead 3 includes a first narrowed portion 12a. Further, a stepped portion is formed between the inner lead 2 and the outer lead 5 so that the lower surface of the outer lead is lower than a lower surface of the inner lead. Note that, the lower surface of the inner lead and a lower surface of the island have the same height. The inner lead suspension lead 3 and the island suspension lead 4 each have a folded portion. Thus, a portion of a lower surface of the inner lead suspension lead 3, which is connected to the lead frame rim surrounding therearound, is relatively lower than a portion of the lower surface of the inner lead suspension lead 3, which is connected to the inner lead 2.

For the island suspension lead 4, similarly, a portion of a lower surface of the island suspension lead 4, which is connected to the lead frame rim surrounding therearound, is relatively lower than a portion of the lower surface of the island suspension lead 4, which is connected to the island 6. In other words, the lead frame of this embodiment is a lead frame in which the island and the inner leads are raised. The lead frame 1 described above can be formed by die stamping and embossing a plate that has a predetermined thickness and is made of a 194 alloy material or a copper alloy. In other words, the plate is stamped for determining planar shapes of the island 6, the inner lead 2, the outer lead 5, the inner lead suspension lead 3, and the island suspension lead 4.

Next, the plate is upwardly embossed so that the island 6, the inner lead 3, a portion of the inner lead suspension lead 3, and a portion of the island suspension lead 4 are relatively higher than other portions. At this time, a step is formed between the inner lead 2 and the outer lead 5. At the same time, a folded portion is formed to each of the inner lead suspension lead 3 and the island suspension lead 4.

Figure 6B:
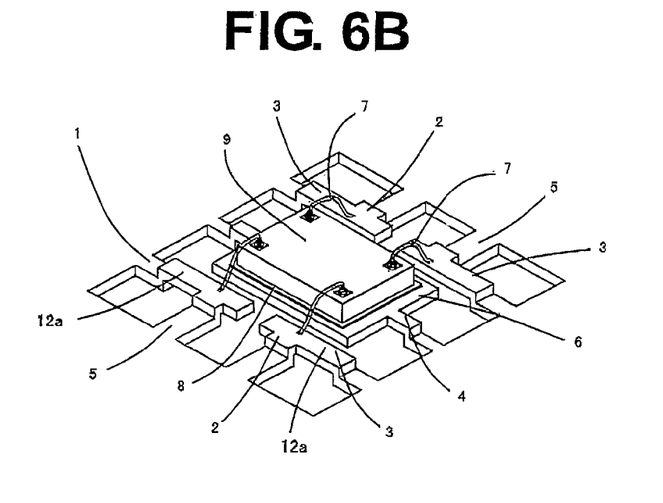

FIG. 6B is a perspective view of a state after a wire-bonding process. A semiconductor chip 9 is die-bonded on the island 6 of the shaped lead frame 1 through intermediation of a paste 8. Then, an electrode pad formed on the surface of the semiconductor chip and the inner lead 2 are electrically connected to each other via a wire 7.

Figure 6C:
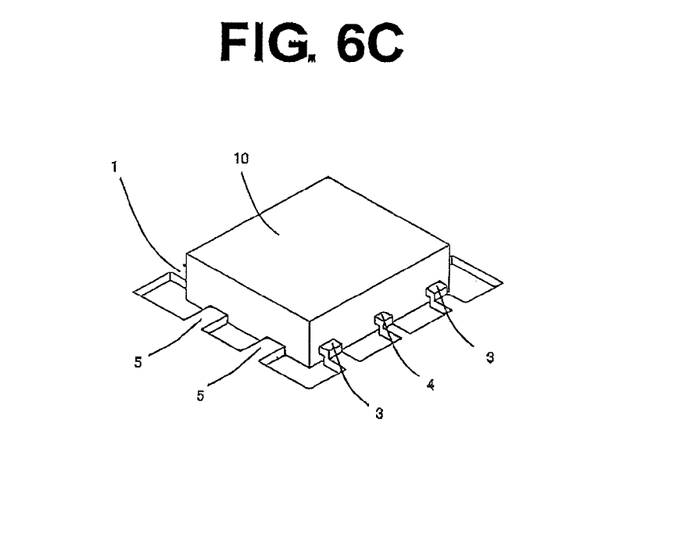

FIG. 6C is a perspective view of a state after a resin encapsulating process. The semiconductor chip 9, the wire 7, and the inner lead 2 are encapsulated by the encapsulating resin 10 so as to be covered therewith. Although not illustrated, the lower surface of the island 6 is also covered with the encapsulating resin 10. The outer lead 5, the inner lead suspension lead 3, and the island suspension lead 4 are partially exposed from the encapsulating resin 10 to be connected to the lead frame rim. At this time, the folded portions of the inner lead suspension lead and the island suspension lead 4 also protrude from the encapsulating resin 10 to the outside. The first narrowed portion 12a is located at a boundary between a portion of the inner lead suspension lead 3 covered with the encapsulating resin 10 and a portion of the inner lead suspension lead 3 exposed from the encapsulating resin 10.

Figure 6D:
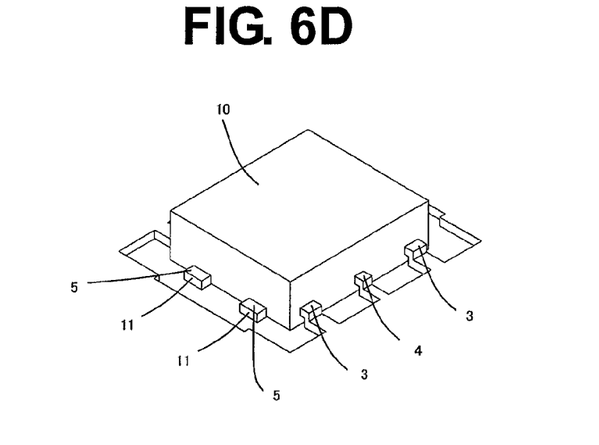

FIG. 6D is a perspective view of a state after an outer lead cutting process. A distal end portion of the outer lead 5, which is exposed from a side surface of the encapsulating resin 10, is cut so that the outer lead 5 is separated off from the lead frame rim, to thereby form the cut surface 11. At this time, on another side surface of the encapsulating resin 10, the inner lead suspension lead 3 and the island suspension lead 4 are partially exposed from the encapsulating resin 10 and connected to the lead frame rim. For this reason, the lead frame rim and the outer lead cut surface 11 maintain the electrical connection therebetween. When electrolytic plating is applied to the exterior in this state, the plated film is formed not only on the upper surface, the bottom surface, and the side surfaces of the outer lead 5, but also on the cut surface 11.

Figure 6E:
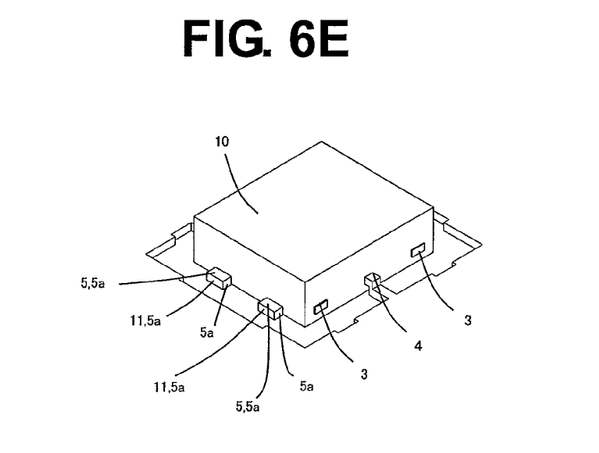
Figure 6F:
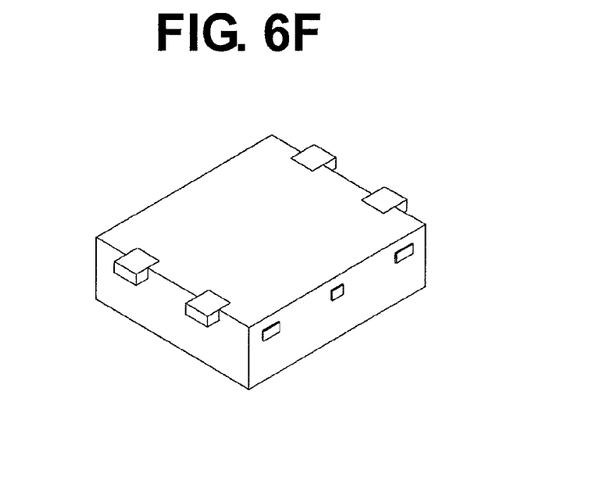

FIG. 6E is a perspective view of a state after the inner lead suspension lead 3 is cut through the exterior plating process. A plated film 5a is formed on the surface of the outer lead 5, and the inner lead suspension lead 3, which is no longer needed, is cut at the first narrowed portion to be separated off from the lead frame rim. The first narrowed portion is narrower (has a smaller cross-sectional area) than the inner lead suspension lead 3. Thus, a load generated when the cutting is performed is small, and impact transmitted to the inner lead encapsulated in the encapsulating resin is accordingly small. In this manner, it is possible to avoid a problem in that the wire comes off the inner lead.

The island suspension lead 4 is connected to the lead frame rim, and hence a plurality of semiconductor devices are mounted on one lead frame. An efficient test can be made by performing electrical characteristics test (strip test) in this state. After that, the island suspension lead 4 is separated off to singulate the semiconductor devices, thereby obtaining a shape illustrated in FIG. 6F.

Through the manufacturing method described above, the plated film is formed on all of the surfaces of the outer lead, and hence the semiconductor device capable of firmly connecting to the substrate and maintaining a good connection between the inner lead and the wire can be obtained.

FIGS. 7A to 7D are plan views each illustrating a lead frame according to one embodiment of the present invention for the semiconductor device.

Figure 7A:
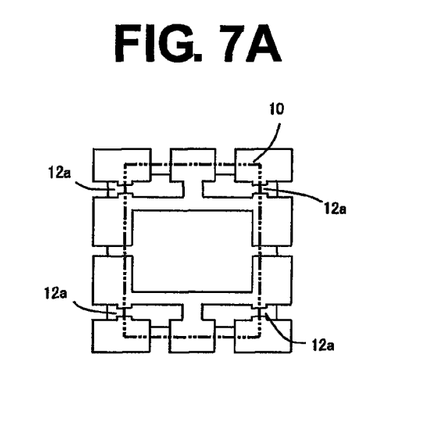
FIGS. 7A to 7D are plan views each illustrating a lead frame according to one embodiment of the present invention to be used for the semiconductor device of the present invention.

FIG. 7A is a plan view of a lead frame to be used for the semiconductor device described with reference to FIGS. 6A to 6F, the lead frame having the first narrowed portion 12a. This embodiment has a feature in that the outline of the encapsulating resin 10 and the first narrowed portion 12a of the lead frame overlap with each other. The presence of the first narrowed portion 12a can reduce impact to be generated when the inner lead suspension lead is cut.

Figure 7B:
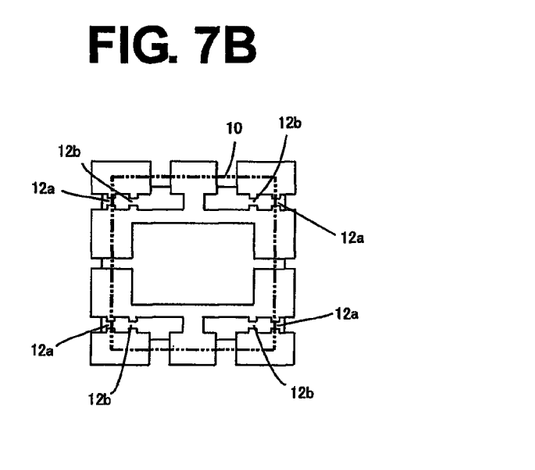

FIG. 7B is a plan view of a lead frame having a second narrowed portion 12b in addition to the first narrowed portion 12a of FIG. 7A. In the configuration of FIG. 7B, the outline of the encapsulating resin 10 and the first narrowed portion 12a of the lead frame overlap with each other, and the second narrowed portion 12b is encapsulated in the encapsulating resin 10. The presence of the first narrowed portion 12a can reduce impact to be generated when the inner lead suspension lead is cut, and the presence of the second narrowed portion 12b can decrease an amount of impact transmitted from the outside to the inner lead.

Figure 7C:
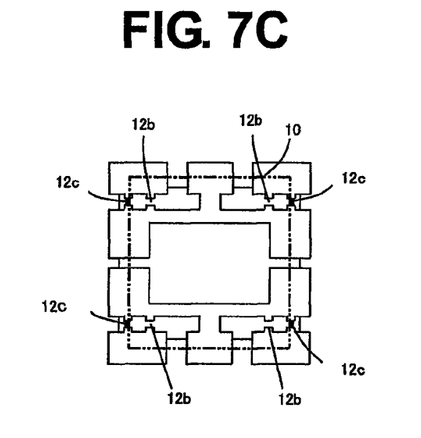
Figure 8:
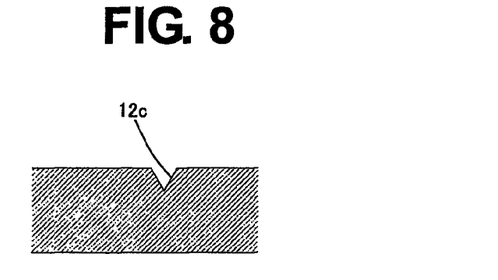
FIG. 8 is a cross-sectional view illustrating a semiconductor device according to one embodiment of the present invention.

FIG. 7C differs from FIG. 7B in that a V notch is formed in the first narrowed portion 12a to obtain a narrowed V notch shape 12c. As illustrated in a cross-sectional view of FIG. 8, the V notch shape is obtained by forming a V notch in a portion of the inner lead suspension lead, at which the inner lead suspension lead is to be cut. With this, a load to be generated when the inner lead suspension lead is cut is further reduced, and impact to be transmitted to the inner lead encapsulated in the encapsulating resin is further reduced accordingly.

Figure 7D:
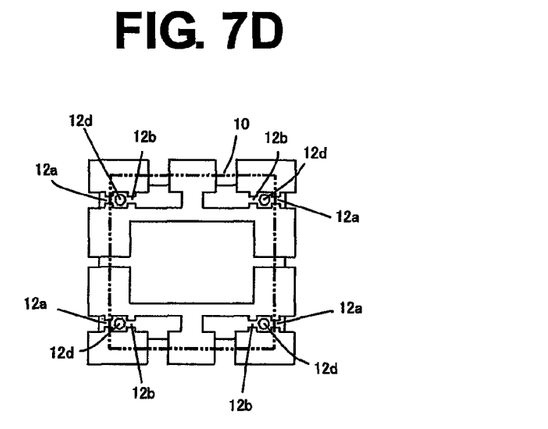

FIG. 7D differs from FIG. 7B in that a through-hole 12d is formed between the first narrowed portion 12a and the second narrowed portion 12b of the inner lead suspension lead. The through-hole 12d, which is filled with an encapsulating resin, has an effect of hardly transmitting to the inside impact generated when the inner lead suspension lead is cut. The above-mentioned effect is obtained because, due to the presence of the through-hole 12d, not only the suspension lead is fixed by the filled encapsulating resin, but also a cross-sectional area of the lead surrounding the through-hole 12d formed between the first narrowed portion 12a and the second narrowed portion 12b is reduced.

What is claimed is:

1. A method of manufacturing a semiconductor device, comprising:
    preparing a lead frame comprising:
        an island;
        an inner lead disposed close to the island;
        an inner lead suspension lead and an outer lead each connected to the inner lead; and
        an island suspension lead connected to the island,
        the inner lead suspension lead including a first narrowed portion that is smaller in cross-sectional area than other portions of the inner lead suspension lead;
    die-bonding, wire-bonding, and resin encapsulating a semiconductor chip so that the first narrowed portion overlaps an outline of the encapsulating resin in plan view;
    cutting a distal end of the outer lead;
    forming, by electrolytic plating, a plated film on the cut surface of the outer lead;
    cutting the inner lead suspension lead at the first narrowed portion; and
    cutting the island suspension lead.

2. The method of manufacturing a semiconductor device according to claim 1, further comprising testing electrical characteristics of the semiconductor chip between the cutting of the inner lead suspension lead and the cutting of the island suspension lead.

3. A method of manufacturing a semiconductor device, comprising:
    preparing a lead frame that includes an island, an inner lead spaced from the island, an inner lead suspension lead connected to the inner lead and having a narrowed portion that is smaller in cross-sectional area than other portions of the inner lead suspension lead, and an outer lead connected to the inner lead;
    die-bonding a semiconductor chip to the island;
    wire-bonding the inner lead to the semiconductor chip;
    resin encapsulting the semiconductor chip, the island, the inner lead, the wire, the outer lead and the inner lead suspension lead so that part of the outer lead and part of the inner lead suspension lead protrude from the resin and an outline of the resin overlaps the narrowed portion of the inner lead suspension lead in plan view;
    cutting the outer lead at the part that protrudes from the resin;
    plating a plated film on all surface portions of the cut outer lead that protrude from the resin; and
    cutting the inner lead suspension lead at the part of the narrowed portion that protrudes from the resin.

4. The method of manufacturing a semicondcutor device according to claim 3; wherein the cutting of the inner lead suspension lead is carried out after plating the plated film on the cut outer lead.

5. The method of manufacturing a semiconductor device according to claim 3; wherein
    the preparing a lead frame includes preparing the lead frame that includes an island suspension lead connected to the island, and the resin encapsulating includes resin encapsulating the island suspension lead so that part of the island suspension lead protrudes from the resin; and further comprising:

cutting the island suspension lead that protrudes from the resin; and testing electrical characteristics of the semiconductor chip between the cutting of the inner lead suspension lead and the cutting of the island suspension lead.

* * * * *